United States Patent [19]
Le et al.

[11] Patent Number: 5,583,799
[45] Date of Patent: Dec. 10, 1996

[54] M-GAGE DATA ACQUISITION SYSTEM AND METHOD

[75] Inventors: Van Le; Donald L. Friede, both of Austin, Tex.

[73] Assignee: Advanced Micro Devices, Sunnyvale, Calif.

[21] Appl. No.: 182,770

[22] Filed: Jan. 18, 1994

[51] Int. Cl.$^6$ .................................................. G01B 21/00
[52] U.S. Cl. ........................ 364/563; 364/481; 364/482
[58] Field of Search .................................... 364/560–563, 364/551.01, 481, 482, 488–491

[56] References Cited

U.S. PATENT DOCUMENTS

| | | | |
|---|---|---|---|
| 4,849,916 | 7/1989 | Abbe et al. | 364/563 |
| 4,860,229 | 8/1989 | Abbe et al. | 364/563 |
| 4,962,461 | 10/1990 | Meyer et al. | 364/482 |
| 4,967,381 | 10/1990 | Lane et al. | 364/551.01 |
| 5,390,131 | 2/1995 | Rohrbaugh et al. | 364/490 |
| 5,394,348 | 2/1995 | Abe | 364/580 |

*Primary Examiner*—James P. Trammell
*Attorney, Agent, or Firm*—H. Dale Langley, Jr.

[57] ABSTRACT

A system for measuring thicknesses of a layered workpiece in a silicon integrated circuit manufacturing process. The system includes means for measuring a resistivity of said workpiece, such as an M-Gage; means for transforming a first signal set output by said means for measuring to a second signal set; and means for determining thicknesses of said workpiece layers from said resistivity capable of interpreting the second signal set. The means for transforming includes an interface board. The interface board receives the first signal set and emits the second signal set for receipt by the means for determining when an appropriate signal is received from the means for determining. [The interface board includes four inputs, first resistors connecting each of the inputs, transistors, each having a base, a collector, and an emitter, connecting each of the first resistors at the bases of the transistors, ground connecting each of the transistors at the emitters of the transistors, inverters and second resistors connecting each of the transistors at the collectors of the transistors, the second resistors each connecting a voltage source, one of the transistors connecting at the collector of the transistor a second inverter, the second inverter connecting a flip-flop, and the flip-flop connecting a second voltage source.] The interface board connects with an input/output interface card of a computer.

3 Claims, 3 Drawing Sheets

M-GAGE DATA ACQUISITION SYSTEM AND METHOD

BACKGROUND OF THE INVENTION

1. Field of the Invention

The invention relates to automated quality control aids in a silicon integrated circuit manufacturing environment and, more particularly, to a method and apparatus for determining thickness of a metal deposited on a silicon wafer during such a manufacturing process and for storing and manipulating the determined thickness data.

2. Background of Invention

In the manufacture of silicon integrated circuit devices, a common procedure is deposition of a metal on a silicon wafer. Thicknesses of deposited metal and silicon wafer are important because the thicknesses affect conductive and resistive properties of a final silicon integrated circuit device obtained from the manufacturing process. It is common then to employ in the manufacturing process some means to measure the wafer and metal thicknesses.

A device referred to as an "M-Gage" has previously been used in silicon integrated circuit manufacturing processes to measure silicon wafer and deposited metal thicknesses. The M-Gage measures the metal and silicon thicknesses by detecting a resistivity of the wafer with the deposited metal. That resistivity is then converted by a formula, based on known properties of the silicon and metal, to a thickness measurement.

In the past, a calculator, such as a Hewlett-Packard 97S or 9815S calculator, has been employed with the M-Gage. The calculator is attached to the M-Gage via a 50-pin binary-coded decimal ("BCD") interface socket located on the rear of the M-Gage. In this arrangement, the calculator receives resistivity data from the M-Gage and, based on formulas and variables programmed into the calculator, the calculator gives thickness data.

This prior arrangement of M-Gage and calculator has proven effective in most instances. This arrangement, however, has certain disadvantages. For example, the calculator may store only limited amounts of data. For many manufacturing processes, greater data storage capacity is desired. In addition, this arrangement of M-Gage and calculator requires substantially continual monitoring and attention by quality control personnel. That monitoring and attention requires not only hand operation of the M-Gage and calculator, but also saving and manipulation of data obtained from the M-Gage and calculator is performed by hand.

As those skilled in the art will appreciate, greater automation of the measurements and thickness determinations would lead to greater efficiency and quality in the silicon integrated circuit manufacturing process. It would be advantageous too, if automation provided for greater data storage capacity and better manipulation, categorization, and compilation of the data obtained during the silicon integrated circuit manufacturing process.

The present invention provides those and other improvements and advantages in the technology. Those skilled in the art will understand and appreciate these advantages and the applications of the invention.

SUMMARY OF THE INVENTION

In one embodiment, the invention is a system for measuring thicknesses of a layered workpiece in a silicon integrated circuit manufacturing process. The invention comprises means for measuring a resistivity of the workpiece and means for determining thicknesses of the workpiece layers from the resistivity.

In another aspect, the means for determining thicknesses includes a computer capable of storing and manipulating data.

In yet another aspect, the means for measuring a resistivity outputs a first signal set indicative of the measured resistivity and the first signal set is transformed to a second signal set by the means for determining thicknesses as part of the determination of thicknesses from the resistivity.

In even another aspect, the invention further comprises means for transforming a first signal set output by the means for measuring to a second signal set readable by the means for determining.

In a further aspect, the means for transforming includes an interface board.

In even another aspect, the interface board receives the first signal set and emits the second signal set for receipt by the means for determining when an appropriate signal is received from the means for determining.

In another further aspect, the interface board includes four inputs, first resistors connecting each of the inputs, transistors, each having a base, a collector, and an emitter, connecting each of the first resistors at the bases of the transistors, ground connecting each of the transistors at the emitters of the transistors, inverters and second resistors connecting each of the transistors at the collectors of the transistors, the second resistors each connecting a voltage source, one of the transistors connecting at the collector of the transistor a second inverter, the second inverter connecting a flip-flop, and the flip-flop connecting a second voltage source.

In another embodiment, the invention is an interface board. The interface board comprises inputs for receiving a first signal set, outputs for delivering a second signal set, and means connecting the inputs and the outputs for receiving the first signal set, detecting an appropriate indication signal, and outputting the second signal set when the appropriate indication signal is detected.

In another aspect, the first signal set is generated by a means for measuring resistivity of a layered workpiece in a silicon integrated circuit manufacturing process.

In yet another aspect, the second signal set is delivered to a computer capable of storing the second signal set and manipulating the second signal set.

In even another aspect, computer calculates a thickness value corresponding to the resistivity measured.

In a further aspect, interface board makes the second signal set available to the computer when the appropriate indication signal is detect.

In even a further aspect, appropriate indication signal is generated by software of the computer.

In another further aspect, the software of the computer causes the computer to store and manipulate the second signal set received by the computer and to calculate the thickness value corresponding to the resistivity measured.

In another embodiment, the invention is a method for measuring thicknesses of a layered workpiece in a silicon integrated circuit manufacturing process. The method comprises the steps of measuring a resistivity of the workpiece and determining thicknesses of the workpiece layers from the resistivity.

In another aspect, the step of determining thicknesses is performed by a computer capable of storing and manipulating data.

In yet another aspect, the step of measuring includes outputting a first signal set indicative of the measured resistivity and the step of determining includes transforming the first signal set into a second signal set.

In even another aspect, the method further comprises the step of transforming a first signal set output in the measuring step to second signal set readable in the determining step.

In yet another aspect, the step of transforming is performed via an interface board.

In a further aspect, the step of transforming includes receiving the first signal set and emitting the second signal set when an appropriate signal is received by the interface board.

In even another aspect, the interface board includes four inputs, first resistors connecting each of the inputs, transistors, each having a base, a collector, and an emitter, connecting each of the first resistors at the bases of the transistors, ground connecting each of the transistors at the emitters of the transistors, inverters and second resistors connecting each of the transistors at the collectors of the transistors, the second resistors each connecting a voltage source, one of the transistors connecting at the collector of the transistor a second inverter, the second inverter connecting a flip-flop, and the flip-flop connecting a second voltage source.

In yet another embodiment, the invention is a method for interfacing. The invention comprises the steps of receiving a first signal set, detecting an appropriate indication signal, and outputting a second signal when the appropriate indication signal is detected.

In another aspect, the first signal set is generated by a means for measuring resistivity of a layered workpiece in a silicon integrated circuit manufacturing process.

In yet another aspect, the step of outputting delivers the second signal set to a computer capable of storing the second signal set and manipulating the second signal set.

In even another aspect, the computer calculates a thickness value corresponding to the resistivity measured.

In a further aspect, the appropriate indication signal is generated by software of the computer.

In even a further aspect, the software of the computer causes the computer to store and manipulate the second signal set delivered to the computer and to calculate the thickness value corresponding to the resistivity measured.

In even another embodiment, the invention is a method of measuring thicknesses of a layered workpiece comprised of silicon and deposited metal, in a silicon integrated circuit manufacturing process. The method comprises the steps of measuring a resistivity of the workpiece, receiving a first signal set, detecting an appropriate indication signal, outputting a second signal set when the appropriate indication signal is detected, receiving the second signal set, and calculating a thickness of the workpiece layers based on the second signal set.

In another aspect, the step of receiving the second signal set is performed by a computer, an input/output interface card connected with the computer, and an interface board including a flip-flop connected with the input/output interface card, comprising the steps of initializing the input/output interface card, setting-up ports of the input/output interface card, resetting a latch of the flip-flop, indicating the latch is ready, initializing an array stored by the computer, opening a file for the array, looking for the second signal set, and polling until the second signal set is received.

The invention also includes the product measurements obtained from the methods.

BRIEF DESCRIPTION OF THE DRAWINGS

For a more complete understanding of the present invention and for further objects and advantages thereof, reference may now be had to the following description in conjunction with the accompanying drawings, in which.

DETAILED DESCRIPTION OF THE INVENTION

The present invention is a significant improvement in the art of silicon integrated circuit manufacture. In particular, the invention dispenses with the calculator employed in the prior technology M-Gage/calculator arrangement for silicon wafer and deposited metal thickness measurement, and, instead, substitutes a personal computer, appropriate interface, and software therefor. The personal computer, interface, and software, together with the M-Gage, perform the functions previously performed by quality control personnel with the prior technology M-Gage/calculator system. As those skilled in the art will appreciate and understand, by automating thickness measurement steps in the silicon integrated circuit manufacturing process, efficiency and improved quality control may be realized.

Figure 1:
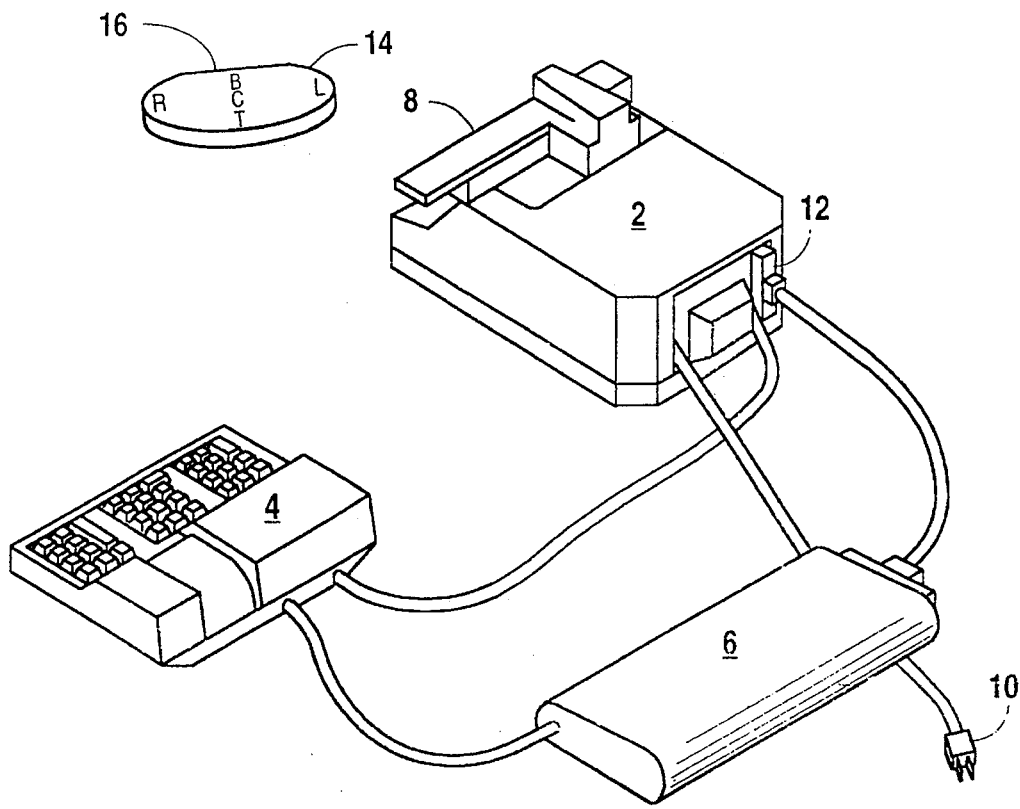
FIG. 1 is a schematic illustration of a prior art M-Gage and calculator system for measuring resistivity of a silicon wafer and deposited metal to yield thickness determinations, in a silicon integrated circuit manufacturing process.

Referring now to FIG. 1, the prior technology M-Gage/calculator system 1 is illustrated. In this prior technology system 1, the M-Gage 2 is employed for taking resistivity measurements of a silicon wafer with deposited metal 14. In the typical process of the prior technology, six resistivity measurements are taken for each wafer with deposited metal 14. As those skilled in the art will appreciate, silicon wafers are typically circular disks of silicon which have a flat portion 16 along the disk circumference. The flat portion 16 serves for orienting the wafer.

Continuing still to refer to FIG. 1, the silicon wafer with deposited metal 14 is aligned in the M-Gage 2 via the flat portion 16 of the wafer 14. Resistivity measurements are taken by the M-Gage 2 by the M-Gage sensing head 8. The silicon wafer with deposited metal 14 is loaded onto the M-Gage 2 and measurements are begun. Note the letters B,C,T,R and L indicating positions on the silicon wafer with deposited metal 14 in FIG. 1. These letters indicate locations at which measurements are taken by the M-Gage 2. The measurements proceed as two sets of three measurements. After loaded, the silicon wafer with deposited metal 14 is measured for resistivity at the points labelled R, C, and L, in that succession. Once those three measurements are made, the silicon wafer with deposited metal 14 is hand-rotated 90 degrees by an operator and then measurements are made at points indicated by T, C, and B, in that succession. The center point C is measured twice. In performing calculations of thickness (as hereinafter described), the second measurement at point C is discarded. After each time resistivity is measured by the M-Gage 2 at a location of the silicon wafer with deposited metal 14, a data ready indication is given by the calculator 4 and resistivity measurement data is passed by the M-Gage 2 to the calculator 4. The signal between M-Gage 2 and calculator 4 passes in 500 µs.

Continuing to refer to FIG. 1, the calculator 4 is attached to the M-Gage 2 by means of a binary coded decimal (BCD) interface 6. In a typical prior technology system, the M-Gage 2 has been a Tencor Model 100 M-Gage available from Tencor Instruments, 2426 Charleston Road, Mountainview, Calif. A typical BCD interface 6 is a 50-pen BCD interface board that connects with the M-Gage 2 at a 50-pen BCD interface socket 12. The calculator 4 has typically been a Hewlett-Packard 97S or 9815S calculator. The M-Gage 2 has an auxiliary ac power socket 18, independent of the M-Gage 2 on/off switch, for power. The M-Gage 2 is powered by available electricity from a wall socket through an electrical cord 10 of the M-Gage 2.

Figure 2:
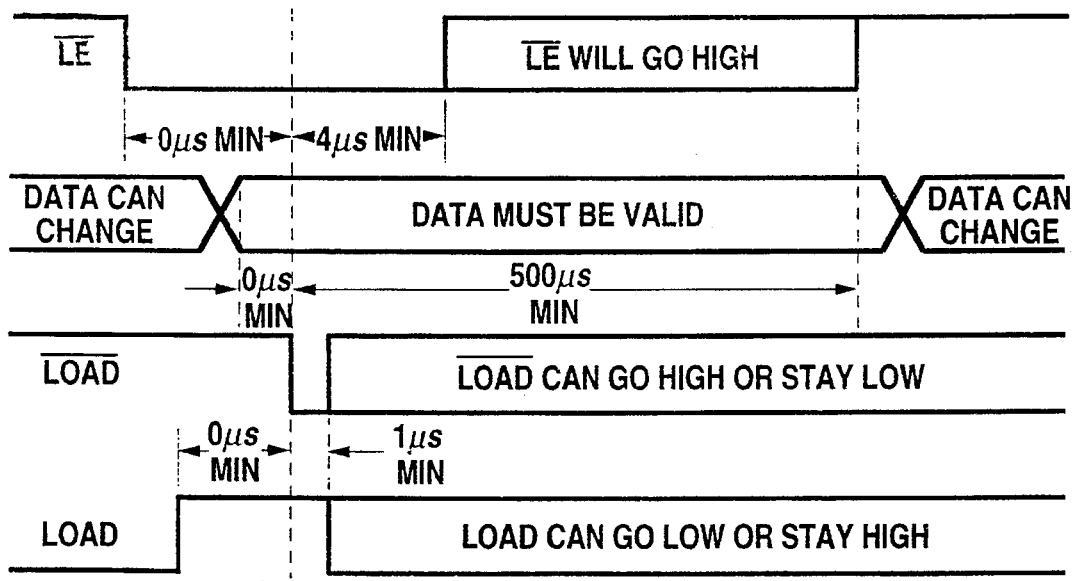
FIG. 2 shows the timing sequences of signals passed between the M-Gage and calculator of the prior art M-Gage and calculator system.

Referring now to FIG. 2, control line timing sequences for the prior technology M-Gage/calculator system 1 are shown. The typical protocol followed for these control line timing sequences is as follows:

1. Clear flag 3 and halt program execution with a R/S, RTN, or PAUSE instruction.
2. If the input register is empty, $\overline{LE}$ will go low.
3. Be sure that the DATA lines are stable before activating the LOAD inputs.
4. Apply an active transition to one of the LOAD inputs while the other is in the active state.
5. Be sure that the DATA lines remain stable for at least 500 µs after activating the LOAD inputs.

As those skilled in the art will appreciate and understand, the control line timing sequences diagram illustrates the timing relationship of the control lines of the system 1 during the loading of data. An active transition of the $\overline{LOAD}$ line is used as an example, but the timing requirements are identical for loading initiated by an active transition of the LOAD line.

Referring now to FIGS. 1 and 2 in conjunction, as previously discussed, the prior technology M-Gage/calculator system 1 requires substantially continual hand monitoring and attention by an operator. The operator performs the steps of loading the silicon wafer with deposited metal 14 onto the M-Gage 2, activating the M-Gage 2 for three resistivity measurements as previously described, causing the silicon wafer with deposited metal 14 to be rotated, and initiating a second set of three resistivity measurements. Data obtained by the M-Gage 2 indicative of the resistivities is transferred via the BCD interface 6 to the calculator 4. At the calculator 4, the resistivity data from the M-Gage 2 is manipulated by a formula saved in the calculator 4 to convert the resistivity value to a thickness measurement based on known resistivity properties of the silicon and deposited metal of the wafer 14.

Still referring to FIGS. 1 and 2 in conjunction, the calculator 4 performs the conversion of resistivity values to thickness data one calculation at a time, that is, the calculator 4 receives a single set of resistivity data, performs a thickness calculation with that data, and displays a thickness readout. The operator must view the calculator 4 readout and must manually record the thickness information given by the calculator 4. As can be appreciated, this is a time consuming task for the operator and the necessary operator intervention can result in inefficiencies and inaccuracies. Once an operator has tabulated data obtained from the calculator 4 of this prior technology system 1, the data may then be manipulated by separate activities. Typically, other personnel will take the tabulated data and enter it into a log, sometimes kept on a personal computer. Note, however, several operators and personnel are required in order to obtain measurement data and create a data base log of that data. Those skilled in the art will appreciate that it would be a significant improvement in the art and technology if the interference of operators and personnel was limited by total automation of the process.

Figure 3:
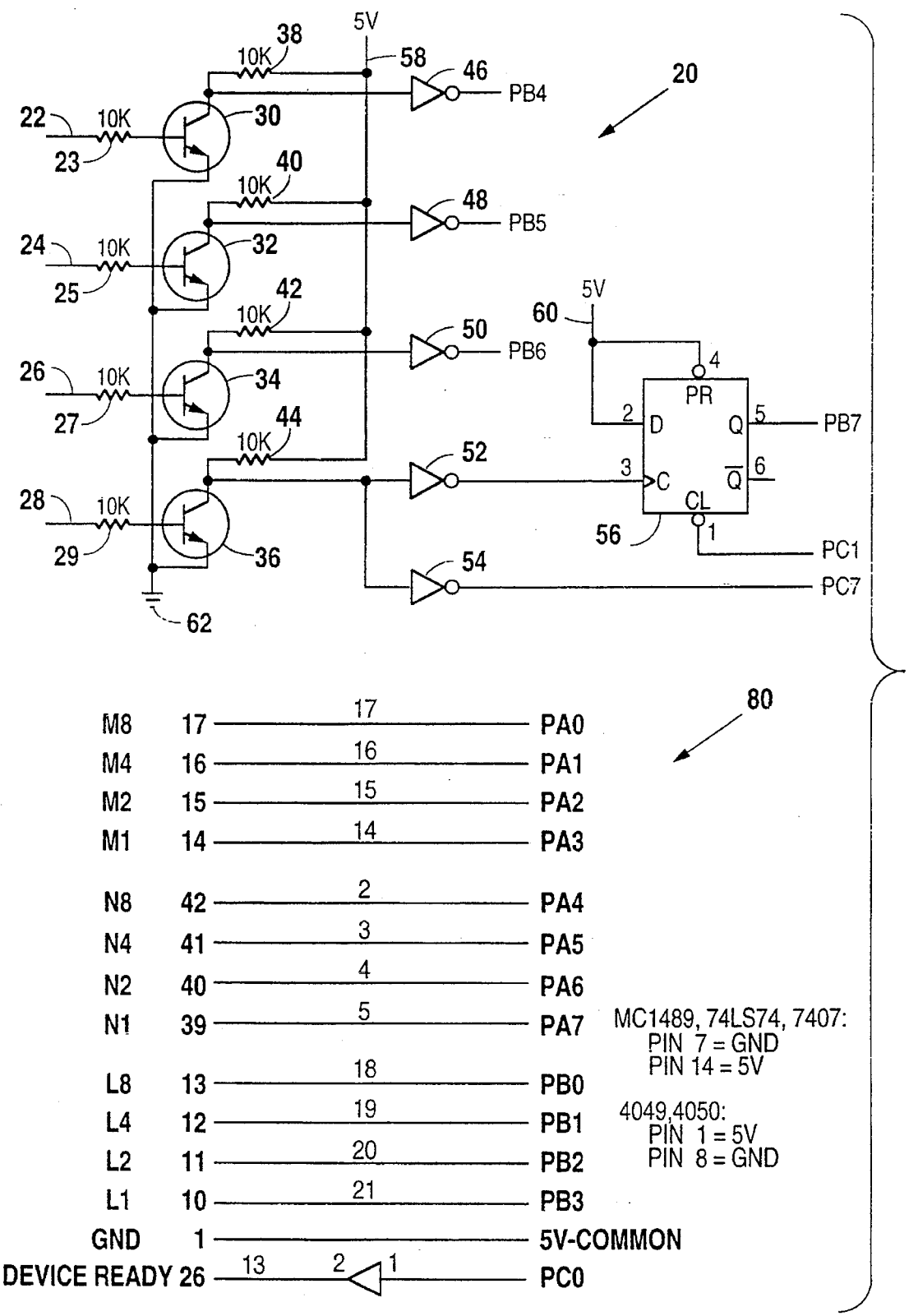
FIG. 3 is a schematic diagram of the circuitry of an interface board of the present invention for interfacing an M-Gage to a personal computer and also of illustrative timing sequences for such circuitry.

Referring now to FIG. 3, the present invention which automates the thickness measurement and data storage and manipulation processes may be understood. FIG. 3 is a circuit schematic of an interface board 20 for interfacing the M-Gage 2 (shown in FIG. 1) with a personal computer (not shown). In the invention, the M-Gage 2 is connected with the interface board 20 of the present invention, which interface board 20 connects with an input/output (I/O) card (not shown) of a personal computer. The I/O card communicates with the personal computer through an existing expansion bus of the personal computer. In a preferred embodiment of the invention, the I/O card of the personal computer is a 24 bit parallel digital I/O interface, for example, the model PIO12 I/O interface board available from MetraByte Corporation, 440 Myles Standish Boulevard, Taunton, Mass. Further in the preferred embodiment, the personal computer is an IBM PC/XT/AT or compatible computer.

Continuing still to refer to FIG. 3, the circuitry of the interface board 20 for allowing the M-Gage 2 (shown in FIG. 1) to interface with the personal computer via the I/O interface card can be understood. The interface board 20 is necessary when interfacing the M-Gage 2 with a personal computer because the M-Gage 2 control timing is not compatible with that acceptable to the personal computer. The interface board 20, when interfaced as described herein, operates essentially by accepting data from the M-Gage 2 according to the M-Gage 2 control timing sequences shown in FIG. 2, then manipulating that data to output the data according to control timing sequences acceptable to the I/O interface card of the personal computer for use by the personal computer. The calculator 4 (shown in FIG. 1) of the prior art accepts data from the M-Gage 2 piece meal by waiting for a data ready signal and only accepting a single set of data each time after such a signal is received. The personal computer bus, on the other hand, is not fast enough in this respect and cannot itself determine when the software program running on the computer is polled. The present invention, therefore, allows the data from the M-Gage 2 to be readable by the personal computer.

Continuing to refer to FIG. 3, the interface card 20 of the present invention is seen to include four inputs 22,24,26,28. Each of those inputs 22,24,26,28 is connected to a resistor 23,25,27,29, respectively. In the preferred embodiment of the interface board 20, these resistors 23,25,27,29 are 10 kΩ. Each of the resistors 23,25,27,29 is also connected to the base of a transistor 30,32,34,36, respectively. The emitter of each of the transistors 30,32,34,36 is connected to ground 62. The collector of each of the transistors 30,32,34,36 is connected to resistors 38,40,42,44, respectively. In a preferred embodiment, these resistors 38,40,42,44 are each 10 kΩ. The resistors 38,40,42,44 each connect with power supply 58, which, in a preferred embodiment, is 5 V.

Further referring to FIG. 3, the collector of transistor 36 is also connected to dual inverters 52,54. The collectors of transistors 30,32,34 are connected to inverters 46,48,50, respectively. The inverters 46,48,50 connect with the I/O interface card at pins PB4, PB5, and PB6, respectively.

Inverter 52, however, is connected to a flip flop 56. The flip flop 56 is connected with a power supply 60, preferably 5 V Signals at 1 and 5 of the flip flop 56 (see FIG. 3) pass to the I/O interface card of the personal computer via pins PB7 and PC1. Inverter 54 is connected to pin PC7 of the I/O interface card of the personal computer. FIG. 3 indicates control timing of the interface board 20 signals.

Continuing to refer to FIG. 3, those skilled in the art will understand and appreciate the various aspects of the invention illustrated by the circuit schematic and control timing diagrams. Though the figures are intended to illustrate the preferred embodiment of the interface board 20 of the present invention, it is to be expressly understood that numerous variations according to the principles hereof are possible. All those variations are intended to be included in the description of the invention herein.

Figure 4:
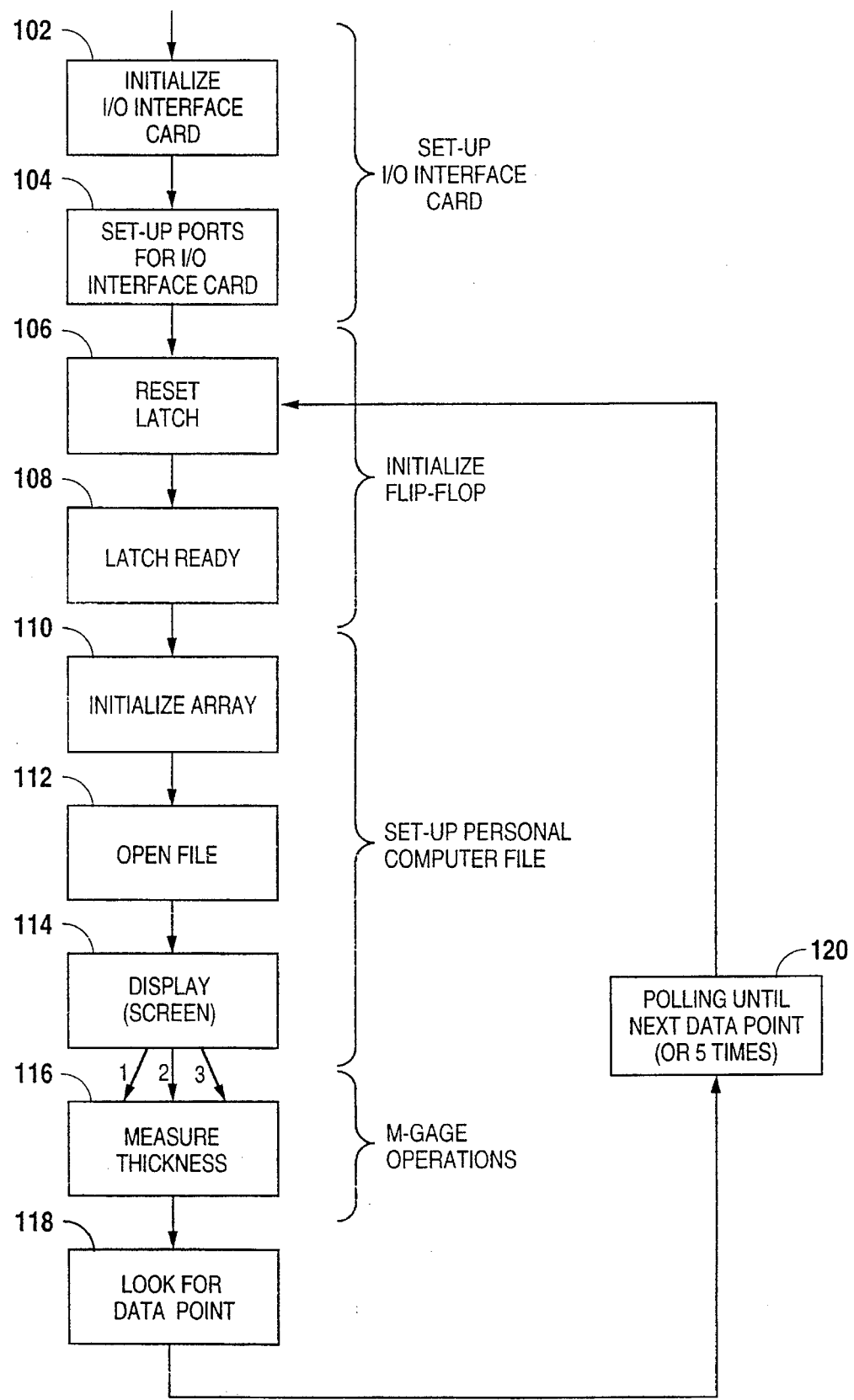
FIG. 4 is a simplified flow chart of steps of a method of the present invention for measuring, storing, and manipulating silicon integrated circuit thickness measurement data.

Referring next to FIG. 4, a flow chart of the method of the invention is shown. The method could be performed by either software with appropriate system apparatus, by hardware, or by combinations thereof. In any event, the invention operates substantially according to the flow chart sequence, although those skilled in the art will understand and appreciate that variations in that sequence may be appropriate (if possible), and all those variations are to be considered as included in the invention.

Continuing to refer to FIG. 4, the flow chart sequence may be more fully described. Initially, the I/O interface board which connects with the personal computer is initialized 102. Next, ports of the I/O interface card are set up 104 to receive data. After the ports are set up 104, the flip flop 56 (see FIG. 3) is initialized, for example, by first resetting the latch 106 and then indicating latch is ready 108.

Continuing to refer to FIG. 4, once the I/O interface card is set up and the flip flop 56 initialized, the personal computer is set up by first initializing an array 110. After the array is initialized 110, a new file is opened 112. In a preferred embodiment of the invention, a new file is opened for each new run, for example, each day. After a new file is opened 112, the computer displays 114 various tabular information regarding measurement data. For example, the personal computer may display I/O interface card and flip flop status, information about any current wafer for which measurements are taken, summary information about all wafers in process in the particular run, various statistical data calculated by the personal computer regarding the runs and wafers, and other information.

Still referring to FIG. 4, after setup of the I/O interface card, initialization of the flip flop 56, and setup of the personal computer, the M-Gage 2 is operated to measure resistivity of a silicon wafer with deposited metal 14. As previously described, two sets of three measurements each are made by the M-Gage 2 of each wafer 14. At each measurement, the system looks for a data point 118. The system looks for a data point 118 by polling 120 until a next data signal is received or five polling sequences, whichever occurs first. If a data point is detected, the data is then read by the personal computer via the I/O interface card and expansion bus of the computer. Once data is read or (if first to occur) the five successive pollings have occurred, a signal is sent which causes reset of the latch 106 to again begin the process of initializing the flip flop 56. The process is then repeated from that step in the flow chart forward.

A preferred embodiment of the invention utilizing a Tencor Model 100 M-Gage, the interface board of FIG. 3, a MetraByte Corporation 24 bit parallel digital I/O interface Model PIO12, and an IBM or IBM compatible personal computer, as all previously described, will operate in the aforementioned sequence according to FIG. 4 if the following software is utilized by the personal computer. The following computer program is written in the C++ language and has been compiled by the Borland C++ compiler. A listing of the program is as follows:

```
/*fffffffffffffffffffffffffffffffffffffffffffffff*
 *                                                *
 *    By Van Le, Fab10 Thinfilms, May 1992        *   ● Advanced Micro Devices 1992
 *                                                *
 *    Developed for MGAUGE Measurement system     *
 *                                                *
 &fffffffffffffffffffffffffffffffffffffffffffffffx
 */ include "mgauge.h"

unsigned char porta[maxpoint],portb[maxpoint],paa[6],pbb[6];
float values[maxpoint],thickness[maxpoint];
char numstr[maxpoint][10];
char thickstr[maxpoint][10];
char thickm[10],thickd[10],sheetm[10],sheetd[10];
float resistivity,thickmean,thickdev,sheetmean,sheetdev;
struct scancode {
  unsigned char ascii;
  unsigned char scan;
  };
char fname[12],lastdate[8],newdate[8],*newtoday;
char newfile,*resstr;
int wafernumber,rescode,datal,datat,datar,datab;

typedef struct wafertype {
  char num[4];
  char day[20];
  char time[20];
  char topt[6],bottomt[6],leftt[6],rightt[6],centert[6];
  char tops[6],bottoms[6],lefts[6],rights[6],centers[6];
  char meant[6],devt[6];
  char means[6],devs[6];
  } wafertype;
wafertype circlist[maxlist];
char wn[4],currentdate[20],currenttime[20];
int currptr,endptr,viewptr;
FILE *fout,*fin;

/****************************************/ void init()
{
  int g_driver,g_mode,g_error;
  int i;
detectgraph(&g_driver,&g_mode);
if (g_driver < 0)
  {
  printf("No graphics hardware detected \n");
  exit(1);
  }
printf("Detected graphics driver #%d,"
   "mode #%d\n",g_driver,g_mode);
if (g_mode == EGAHI)
   g_mode = EGALO;
initgraph(&g_driver,&g_mode,"");
g_error = graphresult();
```

```c
if (g_error < 0)
  {
  printf("initgraph error: %s.\n",
      grapherrormsg(g_error));
  exit(1);
  } newdate[7] = lastdate[7] = '\0';
newfile = 0;
wafernumber = 0;

outportb(PS,PORTSETUP);
outportb(PC,LATCHRESET);
outportb(PC,LATCHREADY);
for (i=0;i<maxpoint;i++)
  {
  numstr[i][maxpoint-1] = '\0';
  porta[i] = portb[i] = '0';
  }
currptr = endptr = viewptr = 0;
}
/* end init */

/*******************************************/ void openfile()
{
  char *today;
  time_t seconds;
  int i;
time(&seconds);
today = ctime(&seconds);
fname[0] = today[4];
fname[1] = today[5];
fname[2] = today[6];
fname[3] = today[8];
fname[4] = today[9];
fname[5] = today[22];
fname[6] = today[23];
fname[7] = '.';
fname[8] = 'l';
fname[9] = 'o';
fname[10] = 'g';
fname[11] = '\0';
if (fout!=NULL)
   fclose(fout);
else
   for (i=0;i<7;i++)
      lastdate[i] = fname[i];
fout = fopen(fname,"w");
/*newfile = 0;*/
wafernumber = 0;
}
/* end openfile */

/*******************************************/ void fillwindow(int L,int T,int R,int B,int bkg,int fst)
{
setfillstyle(fst,bkg);
```

```
bar(L,T,R,B);
}
/* end fillwindow */

/*******************************************/ void drawwindow(int L,int T,int R,int B, int clr)
{
  int oldcolor;
oldcolor = getcolor();
setcolor(clr);
line(L,T,R,T);
line(R,T,R,B);
line(R,B,L,B);
line(L,B,L,T);
setcolor(oldcolor);
}
/* end drawwindow */

/*******************************************/ void outlinewindow(int L,int T,int R,int B,int bkg,int fg,int fst)
{
setcolor(fg);
drawwindow(L,T,R,B,fg);
fillwindow(L+1,T+1,R-1,B-1,bkg,fst);
}
/* end outlinewindow */

/*******************************************/ struct scancode get_key()
{
  union REGS reg;
  struct scancode sc;
reg.h.ah = 0;
int86(0x16,®,®);
sc.ascii = reg.h.al;
sc.scan = reg.h.ah;
return sc;
}
/* end get_key */

/*******************************************/ void cursor(int font,int L,int T,int bkg,int fg)
{
  int l,t,r,b;
if (font==0)
   {
   l = L + 1;
   t = T - 5;
   r = L + 8;
   b = T + 8;
   }
 else if (font==1)
   {
   l = L;
   t = T + 10;
   r = L + 12;
```

```c
    b = T + 30;
    }
while (!kbhit())
   {
   moveto(l,t);
   setfillstyle(SOLID_FILL,fg);
   bar(l,t,r,b);
   if (!kbhit())
       delay(150);
   moveto(l,t);
   setfillstyle(SOLID_FILL,bkg);
   bar(l,t,r,b);
   if (!kbhit())
       delay(150);
   }
}
/* end cursor */

/**************************************/ void loop()
{
   int i;
for (i=1;i<100;i++);
}

/**************************************/ char bcdtochar(unsigned char pa, unsigned char MASK8, unsigned char MASK4,
               unsigned char MASK2, unsigned char MASK1)
{
   unsigned char t;
   char digit;
digit = '0';
t = pa;
t = t & MASK8;
if (t!=0)
   digit += 8;
t = pa;
t = t & MASK4;
if (t!=0)
   digit += 4;
t = pa;
t = t & MASK2;
if (t!=0)
   digit += 2;
t = pa;
t = t & MASK1;
if (t!=0)
   digit += 1;
if (digit>'9')
   digit = '0';
return digit;
}
/* end bcdtochar */

/**************************************/ void writestring(int l,int t,int r,int b,int bkg,int fg,int border,
```

```c
                    char ch, char fg, int fst)
  int oldcolor,xoffset,yoffset;
 oldcolor = getcolor();
 if (ch=='o')
    outlinewindow(l,t,r,b,bkg,border,fst);
 else
    fillwindow(l,t,r,b,bkg,fst);
 setcolor(fg);
 xoffset = (r-l-textwidth(s))/2;
 yoffset = (b-t)/2 - textheight(s)/2;
 moveto(l+xoffset,t+yoffset);
 outtext(s);
 setcolor(oldcolor);
 }
 /* end writestring */

/*******************************************/ char bcdtof(int i)
 {
    char msd,nsd,lsd;
    unsigned char temp;

msd = bcdtochar(porta[i],M8MASK,M4MASK,M2MASK,M1MASK);
 nsd = bcdtochar(porta[i],N8MASK,N4MASK,N2MASK,N1MASK);
 lsd = bcdtochar(portb[i],L8MASK,L4MASK,L2MASK,L1MASK);
 temp = portb[i];
 temp = temp & DECIMALPOINT;
 switch (temp)
    {
    case DPFIRST:
         numstr[i][0] = msd;
         numstr[i][1] = '.';
         numstr[i][2] = nsd;
         numstr[i][3] = lsd;
         break;

case DPSECOND:
         numstr[i][0] = msd;
         numstr[i][1] = nsd;
         numstr[i][2] = '.';
         numstr[i][3] = lsd;
         break;

case DPTHIRD:
         numstr[i][0] = msd;
         numstr[i][1] = nsd;
         numstr[i][2] = lsd;
         numstr[i][3] = '.';
         break;

default:
         writestring(errl,errt,errr,errb,errbkg,errfg,errbd,'o',
             errmsg,errstyle);
         get_key();
         fillwindow(errl,errt,errr,errb,runbkg,runstyle);
         return 1;
    }
 values[i] = stof(numstr[i]);
```

```c
return 0;
}
/* end bcdtof */

/**************************************/ void getnewdate()
{
  char *today;
  time_t seconds;
  int i;
time(&seconds);
today = ctime(&seconds);
newdate[0] = today[4];
newdate[1] = today[5];
newdate[2] = today[6];
newdate[3] = today[8];
newdate[4] = today[9];
newdate[5] = today[22];
newdate[6] = today[23];
}
/* end getnewdate */

/**************************************/ char checkdate()
{
if (strcmp(newdate,lastdate)!=0)
   {
   strcpy(lastdate,newdate);
   newfile = 1;
   return 1;
   }
return 0;
}

/**************************************/ void updateday()
{
  time_t seconds;
  char *today;
  int i;
time(&seconds);
today = ctime(&seconds);
today[10] = ',';
today[11] = ' ';
today[12] = today[20];
today[13] = today[21];
today[14] = today[22];
today[15] = today[23];
today[16] = '\0';
writestring(date1,datet1,dater,datet2,LIGHTCYAN,LIGHTRED,WHITE,'f',
            "DATE",datestyle);
writestring(date1,datet2,dater,dateb,LIGHTCYAN,BLACK,WHITE,'f',today,
            datestyle);
for (i=0;i<17;i++)
   currentdate[i] = today[i];
newfile = 0;
}
```

```
/* end updateday */

/**************************************/ void hidedata()
{
fillwindow(sl,st,sr,sb,LIGHTBLUE,datastyle);
fillwindow(sml,smt,smr,smb,LIGHTBLUE,datastyle);
fillwindow(tl,tt,tr,tb,LIGHTBLUE,datastyle);
fillwindow(tml,tmt,tmr,tmb,LIGHTBLUE,datastyle);
}

/**************************************/ void getdata(int index)
{
  unsigned char pb;
do {
  pb = inportb(PB);
  pb = pb & DATAREADY;
  if (kbhit())
      break;
  } while (pb==0);
paa[index] = inportb(PA);
pbb[index] = inportb(PB);
outportb(PC,LATCHRESET);
outportb(PC,LATCHREADY);
}
/* end getdata */

/**************************************/ char convertdata()
{
  int i;
  char ch;
for (i=0;i<(maxpoint-1);i++)
   {
   porta[i] = paa[i];
   portb[i] = pbb[i];
   }
porta[maxpoint-1] = paa[maxpoint];
portb[maxpoint-1] = pbb[maxpoint];
for (i=0;i<maxpoint;i++)
   {
   ch = bcdtof(i);
   if (ch==1)
       return 1;
   }
 return 0;
}
/* end convertdata */

/**************************************/ void checkpointer(int *ptr)
{
   int currptr;
currptr = *ptr;
if (currptr>=maxlist)
```

```c
    currptr = 0;
if (currptr==endptr)
  if (endptr==maxlist)
      endptr = 0;
  else
      endptr++;
*ptr = currptr;

/* end checkpointer */

/**************************************/ void addlist()
{
strcpy(circlist[currptr].num,wn);
strcpy(circlist[currptr].day,currentdate);
strcpy(circlist[currptr].time,currenttime);

strcpy(circlist[currptr].topt,thickstr[0]);
strcpy(circlist[currptr].bottomt,thickstr[1]);
strcpy(circlist[currptr].leftt,thickstr[2]);
strcpy(circlist[currptr].rightt,thickstr[3]);
strcpy(circlist[currptr].centert,thickstr[4]);

strcpy(circlist[currptr].tops,numstr[0]);
strcpy(circlist[currptr].bottoms,numstr[1]);
strcpy(circlist[currptr].lefts,numstr[2]);
strcpy(circlist[currptr].rights,numstr[3]);
strcpy(circlist[currptr].centers,numstr[4]);

strcpy(circlist[currptr].meant,thickm);
strcpy(circlist[currptr].devt,thickd);
strcpy(circlist[currptr].means,sheetm);
strcpy(circlist[currptr].devs,sheetd);

currptr++;
checkpointer(&currptr);
}
/* end addlist */

/**************************************/ void writefile()
{
   int i;
fprintf(fout,"%d\n",wafernumber);
fprintf(fout,"%.2f\n",resistivity);
for (i=0;i<maxpoint;i++)
   fprintf(fout,"%.2f  %.2f\n",thickness[i],values[i]);
fprintf(fout,"%.2f  %.2f\n",thickmean,sheetmean);
fprintf(fout,"%.2f  %.2f\n",thickdev,sheetdev);

addlist();
}
/* end writefile */

/**************************************/ void ftostr(float f, char *r)
{
```

```
      char *s;
    int dec,sign,i;
if (f==0.0)
    {
    r[0] = '0';
    r[1] = '.';
    r[2] = '0';
    r[3] = '0';
    r[4] = '0';
    r[5] = '\0';
    return;
    }
s = ecvt(f,maxstr,&dec,&sign);
i = 0;
if (dec<0)
    {
    r[i++] = '0';
    r[i++] = '.';
    while (dec<0)
        {
        r[i++] = '0';
        dec += 1;
        }
    while (i<=maxstr)
        {
        r[i++] = *s;
        s++;
        }
    r[i] = '\0';
    }
else
    {
    while (i<=maxstr)
        {
        if (dec==i)
            {
            if (dec==0)
                r[i++] = '0';
            r[i++] = '.';
            }
        else
            {
            r[i++] = *s;
            s++;
            }
        }
    r[i] = '\0';
    }
}
/* end ftostr */

/*************************************/
/*
 Standard Deviation = SUM(xi-mean)**2 div (n-1)
*/ void computemeandev(float *f, float *m, float *d)
{
    int i;
    float *t,sum,h;
```

```
t = f;
sum = 0.0;
for (i=0;i<maxpoint;i++)
   {
   sum += (*t);
   t++;
   };
n = sum/maxpoint;
*m = h;
t = f;
sum = 0.0;
for (i=0;i<maxpoint;i++)
   sum += pow(*t++ - h,2.0);
*d = sqrt(sum/(maxpoint-1));
}
/* end computemeandev */

/************************************/ void tothickness()
{
   int i;
   float resistivity100;
resistivity100 = 100.0 * resistivity;
for (i=0;i<maxpoint;i++)
   {
   thickness[i] = resistivity100 / values[i];
   ftostr(thickness[i],thickstr[i]);
   }
computemeandev(thickness,&thickmean,&thickdev);
computemeandev(values,&sheetmean,&sheetdev);
ftostr(thickmean,thickm);
ftostr(thickdev,thickd);
ftostr(sheetmean,sheetm);
ftostr(sheetdev,sheetd);
}
/* end tothickness */

/************************************/ void displaydata()
{
drawwindow(runl1-2,runt1-2,runr+2,runb+2,WHITE);
outlinewindow(runl1,runt1,runr,runb,LIGHTBLUE,WHITE,datastyle);
line(runl2,runt1,runl2,runb);
line(runl3,runt1,runl3,runb);
line(runl1,runt2,runr,runt2);
line(runl1,runt3,runr,runt3);
writestring(runl1+1,runt2+1,runl2-1,runt2+20,LIGHTBLUE,WHITE,WHITE,'f',
            "Top",datastyle);
writestring(runl1+1,runt2+20,runl2-1,runt2+40,LIGHTBLUE,WHITE,WHITE,'f',
            "Center",datastyle);
writestring(runl1+1,runt2+40,runl2-1,runt2+60,LIGHTBLUE,WHITE,WHITE,'f',
            "Bottom",datastyle);
writestring(runl1+1,runt2+60,runl2-1,runt2+80,LIGHTBLUE,WHITE,WHITE,'f',
            "Left",datastyle);
writestring(runl1+1,runt2+80,runl2-1,runt2+100-1,LIGHTBLUE,WHITE,WHITE,'f',
            "Right",datastyle);
writestring(runl1+1,runt3+1,runl2-1,runt3+30,LIGHTBLUE,WHITE,WHITE,'f',
            "Mean",datastyle);
```

```
writestring(runl1+1,runt3+31,runl2-1,runb-1,LIGHTBLUE,WHITE,WHITE,'f',
            "Standard Deviation",datastyle);
writestring(runl2+1,runt1+4,runl3-1,runt1+18,LIGHTBLUE,WHITE,WHITE,'f',
            "Sheet",datastyle);
writestring(runl2+1,runt1+19,runl3-1,runt1+41,LIGHTBLUE,WHITE,WHITE,'f',
            "Resistance",datastyle);
writestring(runl2+1,runt1+41,runl3-1,runt1+59,LIGHTBLUE,WHITE,WHITE,'f',
            "mOhm/",datastyle);
drawwindow(getx(),gety(),getx()+6,gety()+6,WHITE);
writestring(runl3+1,runt1+19,runr-1,runt1+41,LIGHTBLUE,WHITE,WHITE,'f',
            "Thickness",datastyle);
writestring(runl3+1,runt1+41,runr-1,runt1+59,LIGHTBLUE,WHITE,WHITE,'f',
            "KA",datastyle);
circle(getx()-5,gety()-4,2);
}
/* end displaydata */

/*************************************/ void displaytitle()
{
settextstyle(0,0,3);
writestring(titlel,titlet,titler,titleb,GREEN,WHITE,WHITE,'f',titlename,
            titlestyle);
settextstyle(0,0,0);
}

/*************************************/ void updatestatus(int statuscode)
{
  char *s;
switch (statuscode)
  {
  case 0:
      s = "READY";
      break;

case 1:
      s = "RUNNING";
      break;

case 2:
      s = "MANUAL";
      break;
  }
writestring(statl,statt1,statr,statt2,LIGHTCYAN,LIGHTRED,WHITE,'f',
            "STATUS",statusstyle);
writestring(statl,statt2,statr,statb,LIGHTCYAN,BLACK,WHITE,'f',s,statusstyle);
}
/* end updatestatus */

/*************************************/ void updatewafer()
{
  int temp,i;
temp = wafernumber;
i = 0;
if (temp>99)
```

```c
    {
    wn[i] = temp/100;
    temp = temp%100;
    wn[i] += '0';
    i++;
    }
if (temp>9)
    {
    wn[i] = temp/10;
    temp = temp%10;
    wn[i] += '0';
    i++;
    }
wn[i++] = temp + '0';
wn[i] = '\0';
writestring(waferl,wafert1,waferr,wafert2,LIGHTCYAN,LIGHTRED,WHITE,'f',
            "WAFER",waferstyle);
writestring(waferl,wafert2,waferr,waferb,LIGHTCYAN,BLACK,WHITE,'f',wn,
            waferstyle);
}
/* end updatewafer */

/**********************************/ void updateresistivity()
{
writestring(resl,rest1,resr,rest2,LIGHTCYAN,LIGHTRED,WHITE,'f',
        "RESISTIVITY",resstyle);
writestring(resl,rest2,resr,resb,LIGHTCYAN,BLACK,WHITE,'f',resstr,resstyle);
}

/**********************************/ void displayrun()
{
cleardevice();
fillwindow(0,0,639,479,YELLOW,10);
displaytitle();
fillwindow(lowscrl,lowscrt,lowscrr,lowscrb,LIGHTRED,lowscrstyle);
updatestatus(0);
updatewafer();
updateresistivity();
updateday();
displaydata();
writestring(msgl,msgt1,msgr,msgt2,GREEN,YELLOW,BLACK,'f',msg1,msgstyle);
writestring(msgl,msgt2,msgr,msgb,GREEN,YELLOW,BLACK,'f',msg2,msgstyle);
}
/* end displayrun */

/**********************************/ void updatetime()
{
  time_t seconds;
  char *today,t[10];
time(&seconds);
today = ctime(&seconds);
t[0] = today[11];
t[1] = today[12];
t[2] = today[13];
```

```
t[3] = today[14];
t[4] = today[15];
t[5] = today[16];
t[6] = today[17];
t[7] = today[18];
t[8] = '\0';
writestring(runl1+1,runt1+1,runl2-1,runt2-1,LIGHTBLUE,WHITE,WHITE,'f',
            t,datastyle);
strcpy(currenttime,t);
}
/* end updatetime */

/************************************/ void updatedata(char newtime)
{
  int i;

writestring(runl2+1,runt2+1,runl3-1,runt2+20,LIGHTBLUE,YELLOW,WHITE,'f',
            numstr[0],datastyle);
writestring(runl2+1,runt2+20,runl3-1,runt2+40,LIGHTBLUE,YELLOW,WHITE,'f',
            numstr[1],datastyle);
writestring(runl2+1,runt2+40,runl3-1,runt2+60,LIGHTBLUE,YELLOW,WHITE,'f',
            numstr[2],datastyle);
writestring(runl2+1,runt2+60,runl3-1,runt2+80,LIGHTBLUE,YELLOW,WHITE,'f',
            numstr[3],datastyle);
writestring(runl2+1,runt2+80,runl3-1,runt2+100-1,LIGHTBLUE,YELLOW,WHITE,'f',
            numstr[4],datastyle);

writestring(runl2+1,runt3+1,runl3-1,runt3+30,LIGHTBLUE,YELLOW,WHITE,'f',
            sheetm,datastyle);
writestring(runl2+1,runt3+31,runl3-1,runb-1,LIGHTBLUE,YELLOW,WHITE,'f',
            sheetd,datastyle);

writestring(runl3+1,runt2+1,runr-1,runt2+20,LIGHTBLUE,YELLOW,WHITE,'f',
            thickstr[0],datastyle);
writestring(runl3+1,runt2+20,runr-1,runt2+40,LIGHTBLUE,YELLOW,WHITE,'f',
            thickstr[1],datastyle);
writestring(runl3+1,runt2+40,runr-1,runt2+60,LIGHTBLUE,YELLOW,WHITE,'f',
            thickstr[2],datastyle);
writestring(runl3+1,runt2+60,runr-1,runt2+80,LIGHTBLUE,YELLOW,WHITE,'f',
            thickstr[3],datastyle);
writestring(runl3+1,runt2+80,runr-1,runt2+100-1,LIGHTBLUE,YELLOW,WHITE,'f',
            thickstr[4],datastyle);

writestring(runl3+1,runt3+1,runr-1,runt3+30,LIGHTBLUE,YELLOW,WHITE,'f',
            thickm,datastyle);
writestring(runl3+1,runt3+31,runr-1,runb-1,LIGHTBLUE,YELLOW,WHITE,'f',
            thickd,datastyle);
if (newtime)
  updatetime();
else
  writestring(runl1+1,runt1+1,runl2-1,runt2-1,LIGHTBLUE,WHITE,WHITE,'f',
      circlist[currptr-1].time,datastyle);

updatewafer();
}
/* end updatedata */

/************************************/
```

```
void showwafer(int l1,int l2, int l3,int ptr)
{
  writestring(l1+1,vt3+1,l3-1,vt4-1,viewbkg,viewfg,viewbd,'f',
              circlist[ptr].day,viewstyle2);
  writestring(l1+1,vt4+1,l3-1,vt5-1,viewbkg,viewfg,viewbd,'f',
              circlist[ptr].time,viewstyle2);
  writestring(l1+1,vt5+1,l3-1,vt6-1,viewbkg,viewfg,viewbd,'f',
              circlist[ptr].num,viewstyle2);

writestring(l1+1,vt7+1,l2-1,vt7+20,viewbkg,viewfg,viewbd,'f',
              circlist[ptr].tops,viewstyle2);
  writestring(l1+1,vt7+21,l2-1,vt7+40,viewbkg,viewfg,viewbd,'f',
              circlist[ptr].bottoms,viewstyle2);
  writestring(l1+1,vt7+41,l2-1,vt7+60,viewbkg,viewfg,viewbd,'f',
              circlist[ptr].lefts,viewstyle2);
  writestring(l1+1,vt7+61,l2-1,vt7+80,viewbkg,viewfg,viewbd,'f',
              circlist[ptr].rights,viewstyle2);
  writestring(l1+1,vt7+81,l2-1,vt7+100,viewbkg,viewfg,viewbd,'f',
              circlist[ptr].centers,viewstyle2);

writestring(l2+1,vt7+1,l3-1,vt7+20,viewbkg,viewfg,viewbd,'f',
              circlist[ptr].topt,viewstyle2);
  writestring(l2+1,vt7+21,l3-1,vt7+40,viewbkg,viewfg,viewbd,'f',
              circlist[ptr].bottomt,viewstyle2);
  writestring(l2+1,vt7+41,l3-1,vt7+60,viewbkg,viewfg,viewbd,'f',
              circlist[ptr].leftt,viewstyle2);
  writestring(l2+1,vt7+61,l3-1,vt7+80,viewbkg,viewfg,viewbd,'f',
              circlist[ptr].rightt,viewstyle2);
  writestring(l2+1,vt7+81,l3-1,vt7+100,viewbkg,viewfg,viewbd,'f',
              circlist[ptr].centert,viewstyle2);

writestring(l1+1,vt9+1,l2-1,vt10-1,viewbkg,viewfg,viewbd,'f',
              circlist[ptr].means,viewstyle2);
  writestring(l1+1,vt10+1,l2-1,vt11-1,viewbkg,viewfg,viewbd,'f',
              circlist[ptr].devs,viewstyle2);
  writestring(l2+1,vt9+1,l3-1,vt10-1,viewbkg,viewfg,viewbd,'f',
              circlist[ptr].meant,viewstyle2);
  writestring(l2+1,vt10+1,l3-1,vt11-1,viewbkg,viewfg,viewbd,'f',
              circlist[ptr].devt,viewstyle2);
}
/* end showwafer */

/*******************************************/ char viewwafer()
{
  struct scancode c;
  char key;
  int i;
currptr = currptr - 1;
checkpointer(&currptr);
showwafer(v13,v14,v15,currptr);
viewptr = currptr - 1;
if (viewptr<0)
   viewptr = maxlist - 1;
showwafer(v15,v16,v17,viewptr);
do {
  key = 1;
  c = get_key();
```

```
switch (c.scan)
  {
  case UP:
     if (viewptr!=currptr)
        {
        viewptr++;
        if (viewptr>=maxlist)
           viewptr = 0;
        }
     else
        key = 0;
     break;

case DOWN:
     if (viewptr!=endptr)
        {
        if (viewptr==0)
           viewptr = maxlist - 1;
        else
           viewptr--;
        }
     else
        key = 0;
     break;

case PGUP:
     for (i=1;i<=datapage;i++)
        if (viewptr!=currptr)
           {
           viewptr++;
           if (viewptr>=maxlist)
              viewptr = 0;
           }
        else
           break;
     if (i<=1)
        key = 0;
     break;

case PGDOWN:
     for (i=1;i<=datapage;i++)
        if (viewptr!=endptr)
           {
           if (viewptr==0)
              viewptr = maxlist - 1;
           else
              viewptr--;
           }
        else
           break;
     if (i<=1)
        key = 0;
     break;

default:
     key = 0;
  } if (key)
   showwafer(v15,v16,v17,viewptr);
```

```c
    } while (c.ascii!=ESC);
Currptr++;
checkpointer(&currptr);
return c.ascii;
}
/* end viewwafer */

/*************************************/ void viewdata()
{
cleardevice();
  drawwindow(vl1,vt1,vr,vb,WHITE);
  outlinewindow(vl1+2,vt1+2,vr-2,vb-2,outviewbkg,outviewfg,viewstyle);
  fillwindow(vl3,vt2,vl7,vt12,viewbkg,viewstyle2);
  fillwindow(vl2,vt3,vl3,vt11,viewbkg,viewstyle2);
  drawwindow(vl3,vt2,vl7,vt12,WHITE);
  line(vl2,vt3,vl7,vt3);
  line(vl2,vt4,vl7,vt4);
  line(vl2,vt5,vl7,vt5);
  line(vl2,vt6,vl7,vt6);
  line(vl2,vt9,vl7,vt9);
  line(vl2,vt10,vl7,vt10);
  line(vl2,vt11,vl7,vt11);
  line(vl2,vt3,vl2,vt11);
  line(vl4,vt6,vl4,vt12);
  line(vl5,vt2,vl5,vt12);
  line(vl6,vt6,vl6,vt12);

writestring(vl3+1,vt2+1,vl5-1,vt3-1,viewbkg,viewfg,viewbd,'f',
            "CURRENT WAFER",viewstyle2);
    writestring(vl5+1,vt2+1,vl7-1,vt3-1,viewbkg,viewfg,viewbd,'f',
            "PAST WAFER",viewstyle2);
    writestring(vl2+1,vt3+1,vl3-1,vt4-1,viewbkg,viewfg,viewbd,'f',
            "DATE",viewstyle2);
    writestring(vl2+1,vt4+1,vl3-1,vt5-1,viewbkg,viewfg,viewbd,'f',
            "TIME",viewstyle2);
    writestring(vl2+1,vt5+1,vl3-1,vt6-1,viewbkg,viewfg,viewbd,'f',
            "NUMBER",viewstyle2);

writestring(vl2+1,vt7+1,vl3-1,vt7+20,viewbkg,viewfg,viewbd,'f',
            "Top",viewstyle2);
    writestring(vl2+1,vt7+21,vl3-1,vt7+40,viewbkg,viewfg,viewbd,'f',
            "Center",viewstyle2);
    writestring(vl2+1,vt7+41,vl3-1,vt7+60,viewbkg,viewfg,viewbd,'f',
            "Bottom",viewstyle2);
    writestring(vl2+1,vt7+61,vl3-1,vt7+80,viewbkg,viewfg,viewbd,'f',
            "Left",viewstyle2);
    writestring(vl2+1,vt7+81,vl3-1,vt7+100,viewbkg,viewfg,viewbd,'f',
            "Right",viewstyle2);

writestring(vl2+1,vt9+1,vl3-1,vt10-1,viewbkg,viewfg,viewbd,'f',
            "MEAN",viewstyle2);
    writestring(vl2+1,vt10+1,vl3-1,vt11-1,viewbkg,viewfg,viewbd,'f',
            "STD DEVIATION",viewstyle2);

writestring(vl3+1,vt11+11,vl4-1,vt11+30,viewbkg,viewfg,viewbd,'f',
            "Sheet",viewstyle2);
    writestring(vl3+1,vt11+31,vl4-1,vt11+41,viewbkg,viewfg,viewbd,'f',
            "Resistance",viewstyle2);
```

```c
    writestring(v14+1,vt11+11,v15-1,vt11+41,viewbkg,viewfg,viewbd,'f',
            "Thickness",viewstyle2);
    writestring(v15+1,vt11+11,v16-1,vt11+30,viewbkg,viewfg,viewbd,'f',
            "Sheet",viewstyle2);
    writestring(v15+1,vt11+31,v16-1,vt11+41,viewbkg,viewfg,viewbd,'f',
            "Resistance",viewstyle2);
    writestring(v16+1,vt11+11,v17-1,vt11+41,viewbkg,viewfg,viewbd,'f',
            "Thickness",viewstyle2);

writestring(v12,vt12+20,v17,vt12+40,outviewbkg,outviewfg,outviewbd,'f',
            "ESC to return to Run mode",outviewstyle);
    writestring(v12,vt12+41,v17,vb-20,outviewbkg,outviewfg,outviewbd,'f',
            "Arrow keys and Pgup/Pgdn keys to move data",outviewstyle);

settextstyle(0,0,2);
    writestring(v12,vt1+4,v17,vt2-4,outviewbkg,outviewfg,outviewbd,'f',
            "DATA VIEWING MODE",outviewstyle);
    settextstyle(0,0,0);

viewwafer();
}
/* end viewdata */

/***********************************/ char checkdata()
{
  char ch;
  unsigned char pb;
  struct scancode c;
do {
  pb = inportb(PB);
  pb = pb & DATAREADY;
  if (pb!=0)
      break;
  getnewdate();
  pb = inportb(PB);
  pb = pb & DATAREADY;
  if (pb!=0)
      break;
  ch = checkdate();
  pb = inportb(PB);
  pb = pb & DATAREADY;
  if (pb!=0)
      break;
  if (newfile==1)
      openfile();
  if (kbhit())
      {
      c = get_key();
      if (c.ascii==ESC)
          return 1;
      if (c.ascii=='v' || c.ascii=='V')
          {
          viewdata();
          displayrun();
          updatedata(0);
          }
      }
  pb = inportb(PB);
```

```
     pb = pb & DATAREADY;
  if (pb!=0)
     break;
  if (ch==1)
     updateday();
  } while (pb==0);
return 0;
}
/* end checkdata */

/***************************************/ char run()
{
  int i;
  char ch,ch1;
  struct scancode c;
displayrun();
do {
  ch = checkdata();
  if (ch==1)
     return 1;
  paa[0] = inportb(PA);
  pbb[0] = inportb(PB);
  outportb(PC,LATCHRESET);
  outportb(PC,LATCHREADY);
  hidedata();
  updatestatus(1);
  for(i=1;i<=maxpoint;i++)
     {
     getdata(i);
     if (kbhit())
        {
        c = get_key();
        if (c.ascii==ESC)
           return 1;
        }
     }
  ch1 = convertdata();
  if (ch1==1)
     continue;
  wafernumber++;
  tothickness();
  updatedata(1);
  updatestatus(0);
  if (newfile==1)
     updateday();
  writefile();
  } while (1);
}
/* end run */

/***************************************/ char displaymenu(int L,int T,int toffset, int eoffset)
{
  int l,t,r,b,x,y,oldcolor;
  struct scancode c;
cleardevice();
l = L;
```

```
t = T;
r = L + menuwidth;
b = T + menuheight;
drawwindow(l-2,t-2,r+2,b+2,WHITE);
outlinewindow(l,t,r,b,GREEN,WHITE,menustyle);
moveto(l+toffset,t+20);
outtext("SELECT A RESISTIVITY VALUE");
moveto(l+toffset,t+40);
outtext("===========================");
moveto(l+eoffset,t+titlespace+20);
outtext("1.   ");
outtext(metal1);
moveto(l+eoffset,t+titlespace+40);
outtext("2.   ");
outtext(metal2);
moveto(l+eoffset,t+titlespace+60);
outtext("3.   ");
outtext(stdmetal);
moveto(l+toffset,t+titlespace+90);
outtext("Enter a number: ");
x = getx();
y = gety();
do {
   cursor(0,x,y,GREEN,WHITE);
   c = get_key();
   } while (c.ascii<'1' || c.ascii>'4');
return c.ascii;
}
/* end displaymenu */

/**************************************/ void main()
{
   char ch,exit;
init();
openfile();
exit = 0;
do {
   ch = displaymenu(menuL,menuT,menutos,menueos);
   switch (ch)
       {
      case '1':
         resistivity = 2.9;
         rescode = 1;
         resstr = "Metal 1 .4K - .55K, 2.9 uOhm-cm";
         break;

case '2':
         resistivity = 2.7;
         rescode = 2;
         resstr = "Metal 2 12K, 2.7 uOhm-cm";
         break;

case '3':
         resistivity = 2.7;
         rescode = 3;
         resstr = "Standard 10K, 2.7 uOhm-cm";
         break;
```

```
      case '4':
        exit = 1;
      }
      (!exit)
      run();
    }while (exit==0);
  closegraph();
  fclose(fout);
  printf("Type MGAUGE to run\n");
}
```

```
#include <graphics.h>
#include <string.h>
#include <stdio.h>
#include <stdlib.h>
#include <conio.h>
#include <dos.h>
#include <time.h>
include <math.h> define metal1   "Metal 1        2.9 uOhm-cm"
define metal2   "Metal 2 12K,   2.7 uOhm-cm"
#define stdmetal "Standard 10K, 2.7 uOhm-cm"
#define titlename "THICKNESS MEASUREMENT"
#define msg1 "ESC to select a new resistivity"
#define msg2 " V  to view past data             "
#define errmsg "Measurement Values are Out of Range. Press a Key"
define maxstr 4 define maxpoint 5
define ESC 27
#define PORTSETUP 0x9A
#define PA 0x250
#define PB 0x251
#define PC 0x252
define PS 0x253 define PCINIT 0x02
define LATCHRESET 0x00
#define LATCHREADY 0x02
#define DEVREADY 0x00
#define DEVNOTREADY 0x01
#define DATAREADY 0x80
define DECIMALPOINT 0x30 define M8MASK 0x01
define M4MASK 0x02
#define M2MASK 0x04
define M1MASK 0x08 define N8MASK 0x10
define N4MASK 0x20
#define N2MASK 0x40
define N1MASK 0x80 define L8MASK 0x01
define L4MASK 0x02
#define L2MASK 0x04
define L1MASK 0x08 define DPFIRST 0x20
define DPSECOND 0x10
define DPTHIRD 0x30 define menuL 100
define menuT 150
#define menuwidth 439
#define menuheight 179
#define menutos 100  /* menu title offset */
#define menueos 20   /* menu element offset */
#define titlespace 60
```

```
#define lmin 0
#define tmin 0
#define rmax 639
#define bmax 479
#define titlel 0
#define titlet 0
#define titler 639
define titleb 50 define errl 100
define errt 70
#define errr 540
define errb 100 define runl1 150
define runl2 300
#define runl3 395
#define runt1 120
#define runt2 180
#define runt3 280
#define runr 490
#define runb 340
```

```
/*              runl1        runl2         runl3         runr
        runt1 runt2 runt3 runb
                              */
```

```
#define sl 301
#define st 181
#define sr 394
#define sb 279
#define sml 301
#define smt 281
#define smr 394
#define smb 339
#define tl 396
#define tt 181
#define tr 489
#define tb 279
#define tml 396
#define tmt 281
#define tmr 489
define tmb 339 define lowscrl 0
define lowscrt 428
#define lowscrr 639
define lowscrb 479 define UP 72
define DOWN 80
#define PGUP 73
#define PGDOWN 81
```

```
define datapage 10 define lowscrstyle 1
define datastyle 1
#define menustyle 1
#define titlestyle 6
#define statusstyle 1
#define datestyle 1
#define msgstyle 6
#define waferstyle 1
#define resstyle 1
#define viewstyle 10
#define viewstyle2 1
#define runstyle 10
#define runbkg YELLOW
define outviewstyle 10 define errbkg LIGHTRED
define errfg YELLOW
#define errbd YELLOW
define errstyle 1 define waferl 3
define wafert1 430
#define wafert2 454
#define waferr 51
#define waferb 477
#define resl 55
#define rest1 430
#define rest2 454
#define resr 353
#define resb 477
#define datel 357
#define datet1 430
#define datet2 454
#define dater 534
#define dateb 477
#define statl 538
#define statt1 430
#define statt2 454
#define statr 636
define statb 477 define msgl 100
define msgt1 370
#define msgt2 390
#define msgr 539
define msgb 410 define vl1 0
define vl2 80
#define vl3 220
#define vl4 310
#define vl5 390
#define vl6 480
define vl7 560 define vt1 0
define vt2 70
#define vt3 110
```

```
#define vt4 130
#define vt5 150
#define vt6 170
#define vt7 180
#define vt8 280
#define vt9 290
#define vt10 320
#define vt11 350
define vt12 400 define viewbkg LIGHTBLUE
define viewfg WHITE
#define viewbd WHITE
#define outviewbkg GREEN
#define outviewfg YELLOW
define outviewbd WHITE define vr 639
define vb 479 define maxlist 100
```

As is clearly seen, the present invention overcomes the problems presented by the prior systems and methods and provides many improvements and advantages over those systems and methods. The present invention is believed to be especially effective when configured and employed as described herein, however, those skilled in the art will readily recognize that numerous variations and substitutions may be made in the device and its use and configuration to achieve substantially the same results as achieved by the embodiments and, in particular, the preferred embodiment expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. A system for measuring thicknesses of a layered workpiece in a silicon integrated circuit manufacturing process, comprising:

means for measuring a resistivity of said workpiece;

means for determining a thickness of said workpiece layers from said resistivity;

wherein said means for determining is capable of storing and manipulating multiple resistivity and multiple thickness data;

means for transforming a first signal set output by said means for measuring to a second signal set readable by said means for determining;

wherein said means for transforming includes an interface board:

wherein said interface board receives said first signal set and emits said second signal set for receipt by said means for determining when an appropriate signal is received from said means for determining;

wherein said interface board includes four inputs, first resistors connecting each of said inputs, transistors, each having a base, a collector, and an emitter, connecting each of said first resistors at said bases of said transistors, ground connecting each of said transistors at said emitters of said transistors, inverters and second resistors connecting each of said transistors at said collectors of said transistors, said second resistors each connecting a voltage source, one of said transistors connecting at said collector of said transistor a second inverter, said second inverter connecting a flip-flop, and said flip-flop connecting a second voltage source.

2. A method for measuring thicknesses of a layered workpiece in a silicon integrated circuit manufacturing process, comprising the steps of:

measuring a resistivity of said workpiece; and determining a thickness of said workpiece layers from said resistivity;

transforming a first signal set output in said measuring step to second signal set readable in said determining step;

wherein said step of transforming is performed via an interface board;

wherein said interface board includes four inputs, first resistors connecting each of said inputs, transistors, each having a base, a collector, and an emitter, connecting each of said first resistors at said bases of said transistors, ground connecting each of said transistors at said emitters of said transistors, inverters and second resistors connecting each of said transistors at said collectors of said transistors, said second resistors each connecting a voltage source, one of said transistors connecting at said collector of said transistor a second inverter, said second inverter connecting a flip-flop, and said flip-flop connecting a second voltage source.

3. A method of measuring thicknesses of a layered workpiece comprised of silicon and deposited metal, in a silicon integrated circuit manufacturing process, comprising the steps of:

measuring a resistivity of said workpiece;

receiving a first set;

detecting an appropriate indication signal;

outputting a second signal set when said appropriate indication signal is detected;

receiving said second signal set;

calculating a thickness of said workpiece layers based on said second signal set;

wherein said step of receiving said second signal set is performed by a computer, an input/output interface card connected with said computer, and an interface board including a flip-flop connected with said input/output interface card, comprising the steps of:

initializing said input/output interface card;

setting-up ports of said input/output interface card;

resetting a latch of said flip-flop;

indicating said latch is ready;

initializing an array stored by said computer;

opening a file for said array;

looking for said second signal set; and polling until said second signal set is received.

\* \* \* \* \*